United States Patent
Basu

(10) Patent No.: US 10,628,258 B2
(45) Date of Patent: Apr. 21, 2020

(54) DIE-LEVEL ERROR RECOVERY SCHEME

(71) Applicant: Micron Technology, Inc., Boise, ID (US)

(72) Inventor: Reshmi Basu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/041,204

(22) Filed: Jul. 20, 2018

(65) Prior Publication Data
US 2020/0026600 A1 Jan. 23, 2020

(51) Int. Cl.
G11C 29/00 (2006.01)
G06F 11/10 (2006.01)
G11C 29/52 (2006.01)
G06F 3/06 (2006.01)
G11C 13/00 (2006.01)
G11C 29/42 (2006.01)
H05K 1/18 (2006.01)

(52) U.S. Cl.
CPC ........ *G06F 11/1068* (2013.01); *G06F 3/0619* (2013.01); *G06F 3/0659* (2013.01); *G06F 3/0679* (2013.01); *G11C 13/004* (2013.01); *G11C 13/0069* (2013.01); *G11C 29/42* (2013.01); *G11C 29/52* (2013.01); *G11C 29/78* (2013.01); *G11C 13/0004* (2013.01); *G11C 2213/71* (2013.01); *H05K 1/181* (2013.01); *H05K 2201/10159* (2013.01); *H05K 2201/10522* (2013.01)

(58) Field of Classification Search
CPC .. G06F 11/1068; G06F 3/0619; G06F 3/0659; G06F 3/0679; G11C 29/52; G11C 29/78; G11C 29/42; G11C 13/004; G11C 13/0069; G11C 13/0004
See application file for complete search history.

(56) References Cited

U.S. PATENT DOCUMENTS

2015/0169405 A1* 6/2015 Frickey, III ......... G06F 11/1076
714/764

OTHER PUBLICATIONS

Kim et al; "Resilient Memory Architectures: A very short tutorial on ECC and Repair;" University of Texas, HPCA 2016 (84 pages).
U.S. Appl. No. 15/908,167, fled Feb. 28, 2018, Richard C. Murphy.
U.S. Appl. No. 15/908,184, filed Feb. 28, 2018, Richard C. Murphy.

* cited by examiner

*Primary Examiner* — Samir W Rizk
(74) *Attorney, Agent, or Firm* — Fletcher Yoder, P.C.

(57) ABSTRACT

Methods, apparatuses, and systems for error recovery in memory devices are described. A die-level redundancy scheme may be employed in which parity data associated with particular die may be stored. An example apparatus may include a printed circuit board that has memory devices each disposed on a planar surface of the printed circuit board. Each memory device may include two or more memory die, channels communicatively coupled the two or more memory die, and a memory controller communicatively coupled to the plurality of channels. The memory controller may deterministically maintain a die-level redundancy scheme via data transmission through the plurality of channels. The memory controller may also generate parity data associated with the two or more memory die in response to a data write event.

20 Claims, 5 Drawing Sheets

DIE-LEVEL ERROR RECOVERY SCHEME

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be implemented on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include instructions executable by the processing circuitry to perform an operation and/or may include data to be used as an input for the operation. In addition, in some cases, data output from the operation may be stored in memory, for example, to enable subsequent retrieval.

Furthermore, the data stored in the memory devices may include particular data that is desired to be preserved, retained, or recreated in the case of data loss or memory device malfunction. Resources dedicated to storing such data may be unavailable for other uses and may thus constrain device operability.

BRIEF DESCRIPTION OF THE DRAWINGS

Various aspects of this disclosure may be better understood upon reading the following detailed description and upon reference to the drawings in which.

DETAILED DESCRIPTION

Figure 1:
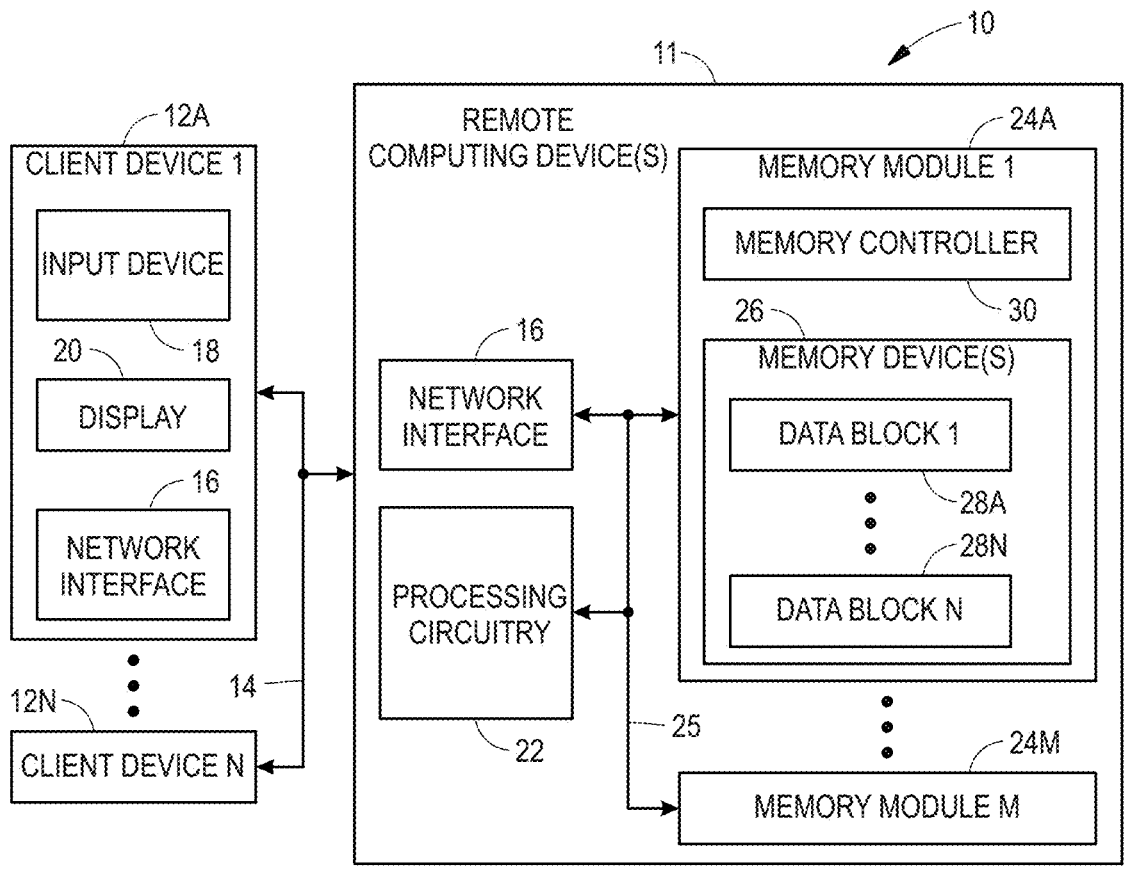
FIG. 1 is a block diagram of a computing system that includes client devices and one or more remote computing devices, in accordance with an embodiment.

A memory device may be designated to store parity data. The parity data may be stored or backed-up in non-volatile memory, or volatile memory powered by an additional power supply, for example, to protect against data loss from power loss or component defect. In some cases, the memory device may store parity data used to recover data for additional memory devices as a way to back-up the data of the additional memory devices. However, in many cases, backing-up a whole memory device may lead to excessive overprovisioning of memory and wasting of resources. So as described herein, a die-level redundancy scheme may be employed in which parity data associated with particular die (rather than a whole memory device) may be stored.

Generally, hardware of a computing system includes processing circuitry and memory, for example, implemented using one or more processors and/or one or more memory devices (e.g., chips or integrated circuits). During operation of the computing system, the processing circuitry may perform various operations (e.g., tasks) by executing corresponding instructions, for example, based on a user input to determine output data by performing operations on input data. To facilitate operation of the computing system, data accessible to the processing circuitry may be stored in a memory device, such that the memory device stores the input data, the output data, data indicating the executable instructions, or any combination thereof.

In some instances, multiple memory devices may be implemented on a memory module, thereby enabling the memory devices to be communicatively coupled to the processing circuitry as a unit. For example, a dual in-line memory module (DIMM) may include a printed circuit board (PCB) and multiple memory devices. Memory modules respond to commands from a memory controller communicatively coupled to a client device or a host device via a communication network. Or in some cases, a memory controller may be implemented on the host-side of a memory-host interface; for example, a processor, microcontroller, or ASIC may include a memory controller. This communication network may enable data communication therebetween and, thus, the client device to utilize hardware resources accessible through the memory controller. Based at least in part on user input to the client device, processing circuitry of the memory controller may perform one or more operations to facilitate the retrieval or transmission of data between the client device and the memory devices. Data communicated between the client device and the memory devices may be used for a variety of purposes including, but not limited to, presentation of a visualization to a user through a graphical user interface (GUI) at the client device, processing operations, calculations, or the like.

Additionally, in some instances, memory devices may be implemented using different memory types. For example, a memory device may be implemented as volatile memory, such as dynamic random-access memory (DRAM) or static random-access memory (SRAM). Alternatively, the memory device may be implemented as non-volatile memory, such as flash (e.g., NAND, NOR) memory, phase-change memory (e.g., 3D XPoint™), or ferroelectric random access memory (FeRAM). In any case, memory devices generally include at least one memory die (i.e., an array of memory cells configured on a portion or "die" of a semiconductor wafer) to store data bits (e.g., "0" bit or "1" bit) transmitted to the memory device through a channel (e.g., data channel, communicative coupling) and may be functionally similar from the perspective of the processing circuitry even when implemented using different memory types.

However, different memory types may provide varying tradeoffs that affect implementation associated cost of a computing system. For example, volatile memory may provide faster data transfer (e.g., read and/or write) speeds compared to non-volatile memory. On the other hand, non-volatile memory may provide higher data storage density compared to volatile memory. Thus, a combination of non-volatile memory cells and volatile memory cells may be used in a computing system to balance the costs and benefits of each type of memory. Non-volatile memory cells, in contrast to volatile memory, may also maintain their stored value or data bits while in an unpowered state. Thus, implementing a combination of non-volatile memory cells and volatile memory cells may change how data redundancy operations are managed in the computing system.

In particular, data of non-volatile or volatile memory cells may be backed-up by non-volatile memory to protect the data of the computing system. In some circumstances, however, memory may be protected against data loss through various redundancy schemes. An example of a redundancy scheme is a redundant array of independent disks, DIMMs, DRAM, 3D XPoint™, or any suitable form of memory, through which memory cells are protected against data loss through following digital logic verification and/or protection techniques, such as exclusive-or (XOR) verification and XOR protection. In XOR protection techniques, the data stored in the non-volatile memories are subjected to an XOR logical operation. The result of the XOR logical operation, often referred to as parity data or parity bits, is stored as the XOR result indicative of the correct data initially stored across the non-volatile memory. In the event of data loss, the data of the defective non-volatile memory may be recreated using the parity data as a replacement for the missing or lost data.

Redundancy schemes, like the one described above, provide a reliable means of protecting memory against data loss. A variety of circumstances may cause data loss including memory malfunction, power loss (e.g., power loss causing data stored in non-volatile memory to not be refreshed to preserve data values), or other similar hardware defects that cause data loss. Redundancy schemes, like the one described above, may be used to recover data down to the smallest granularity of data used in the XOR logical operation. Thus, if a memory device is subjected to an XOR logical operation with other memory devices, and the parity data is used for recovery, the XOR recovery may recover data from the entire memory device after a data loss event.

Commonly, redundancy schemes operate to protect the entire memory device, that is, package-level redundancy schemes that use data of the whole memory device without regard to smaller, more practical data granularity. This may cause overprovisioning since malfunction of the entire memory device is uncommon and unlikely. In some instances, this overprovisioning leads to using larger sized memories to store the parity data and, thus, may increase costs of providing the data protection. Thus, there may be particular advantages to implementing a die-level redundancy scheme to provide protection to individual memory die of the memory device, instead of the memory device or channel as a whole. Die-level redundancy schemes may reduce the overall overprovisioning while also providing one or more spare memory die. For purposes of this disclosure, a redundant array of independent 3D XPoint™ memory (RAIX) is used as an example redundancy scheme that may be improved through die-level redundancy operations.

To facilitate improving RAIX schemes, the present disclosure provides techniques for implementing and operating memory modules to provide die-level RAIX schemes (i.e., die-level redundancy schemes). In particular, a die-level RAIX scheme may enable the memory module to have access to an increased amount of spare memory. Die-level RAIX schemes enable the memory module to back-up data stored in individual memory die regardless of the number of memory devices included on the memory module. These memory die receive data from a memory controller through a channel, or in some embodiments, a channel that provides data to multiple individual memory die located on a same or different memory device. In this way, a memory die may receive data through a dedicated channel (e.g., 1:1 channel to memory die ratio) or through a channel shared with additional memory die (e.g., M:N channel, M, to memory die, N, ratio). In this way, several channels may be allocated to a memory device that includes two or more memory die and one or more memory die may be associated with one or more channels. A die-level RAIX schemes may operate to back-up the data stored in the individual memory die, thus corresponding to the data transmitted through a channel to the memory die, and in this way may decrease over-provisioning and decrease costs of production while providing adequate protection of the memory module data.

In accordance with embodiments described herein, a variety of computing systems may implement die-level RAIX schemes including one or more client devices communicatively coupled to one or more remote computing devices. In these devices, certain computing processes are separated from each other to improve operational efficiency of the computing system. For example, beyond merely controlling data access (e.g., storage and/or retrieval), the memory processing circuitry may be implemented to perform data processing operations, for example, which would otherwise be performed by host processing circuitry. For ease of description, die-level RAIX is described below as implemented in a computing system using these remote computing devices, however, it should be understood that a variety of valid embodiments may implement die-level RAIX schemes. For example, a computing system that does not use remote computing devices and instead combines components of a client device with memory modules and processing circuity of the remote computing devices may be employed.

To help illustrate, FIG. 1 depicts an example of a computing system 10, which includes one or more remote computing devices 11. As in the depicted embodiment, the remote computing devices 11 may be communicatively coupled to the one or more client devices 12 via a communication network 14. It should be appreciated that the depicted embodiment is merely intended to be illustrative and not limiting. For example, in other embodiments, the remote computing devices 11 may be communicatively coupled to a single client device 12 or more than two client devices 12.

In any case, the communication network 14 may enable data communication between the client devices 12 and the remote computing devices 11. In some embodiments, the client devices 12 may be physically remote (e.g., separate) from the remote computing devices 11, for example, such that the remote computing devices 11 are located at a centralized data center. Thus, in some embodiments, the communication network 14 may be a wide area network (WAN), such as the Internet. To facilitate communication via the communication network 14, the remote computing devices 11 and the client devices 12 may each include a network interface 16.

In addition to the network interface 16, a client device 12 may include input devices 18 and/or an electronic display 20 to enable a user to interact with the client device 12. For example, the input devices 18 may receive user inputs and, thus, may include buttons, keyboards, mice, trackpads, and/or the like. Additionally or alternatively, the electronic display 20 may include touch sensing components that receive user inputs by detecting occurrence and/or position of an object touching its screen (e.g., surface of the electronic display 20). In addition to enabling user inputs, the electronic display 20 may facilitate providing visual representations of information by displaying a graphical user interface (GUI) of an operating system, an application interface, text, a still image, video content, or the like.

As described above, the communication network 14 may enable data communication between the remote computing devices 11 and one or more client devices 12. In other words, the communication network 14 may enable user inputs to be communicated from a client device 12 to a remote computing device 11. Additionally or alternatively, the communication network 14 may enable results of operations performed by the remote computing device 11 based on the user inputs to be communicated back to the client device 12, for example, as image data to be displayed on its electronic display 20.

In fact, in some embodiments, data communication provided by the communication network 14 may be leveraged to make centralized hardware available to multiple users, such that hardware at client devices 12 may be reduced. For example, the remote computing devices 11 may provide data storage for multiple different client devices 12, thereby enabling data storage (e.g., memory) provided locally at the client devices 12 to be reduced. Additionally or alternatively, the remote computing devices 11 may provide processing for multiple different client devices 12, thereby enabling processing power provided locally at the client devices 12 to be reduced.

Thus, in addition to the network interface 16, the remote computing devices 11 may include processing circuitry 22 and one or more memory modules 24 (e.g., sub-systems) communicatively coupled via a data bus 25. In some embodiments, the processing circuitry 22 and/or the memory modules 24 may be implemented across multiple remote computing devices 11, for example, such that a first remote computing device 11 includes a portion of the processing circuitry 22 and the first memory module 24A, while an Mth remote computing device 11 includes another portion of the processing circuitry 22 and the Mth memory module 24M. Additionally or alternatively, the processing circuitry 22 and the memory modules 24 may be implemented in a single remote computing device 11.

In any case, the processing circuitry 22 may generally execute instructions to perform operations, for example, indicated by user inputs received from a client device 12. Thus, the processing circuitry 22 may include one or more central processing units (CPUs), one or more graphics processing units (GPUs), one or more processor cores, or any combination thereof. In some embodiments, the processing circuitry 22 may additionally perform operations based on circuit connections formed (e.g., programmed) in the processing circuitry 22. Thus, in such embodiments, the processing circuitry 22 may additionally include one or more application specific integrated circuits (ASICs), one or more field programmable logic arrays (FPGAs), or both.

Additionally, a memory module 24 may provide data storage accessible to the processing circuitry 22. For example, a memory module 24 may store data received from a client device 12, data resulting from an operation performed by the processing circuitry 22, data to be input to the operation performed by the processing circuitry 22, instructions executable by the processing circuitry 22 to perform the operation, or any combination thereof. To facilitate providing data storage, a memory module 24 may include one or more memory devices 26 (e.g., chips or integrated circuits). In other words, the memory devices 26 may each be a tangible, non-transitory, computer-readable medium that stores data accessible to the processing circuitry 22.

Since hardware of the remote computing devices 11 may be utilized by multiple client devices 12, at least in some instances, a memory module 24 may store data corresponding with different client devices 12. To facilitate identifying appropriate data, in some embodiments, the data may be grouped and stored as data blocks 28. In fact, in some embodiments, data corresponding with each client device 12 may be stored as a separate data block 28. For example, the memory devices 26 in the first memory module 24A may store a first data block 28A corresponding with the first client device 12A and an Nth data block 28N corresponding with the Nth client device 12N. One or more data blocks 28 may be stored within a memory die of the memory device 26.

Additionally, in some embodiments, a data block 28 may correspond to a virtual machine (VM) provided to a client device 12. In other words, as an illustrative example, a remote computing device 11 may provide the first client device 12A a first virtual machine via the first data block 28A and provide the Nth client device 12N an Nth virtual machine via the Nth data block 28N. Thus, when the first client device 12A receives user inputs intended for the first virtual machine, the first client device 12A may communicate the user inputs to the remote computing devices 11 via the communication network 14. Based at least in part on the user inputs, the remote computing device 11 may retrieve the first data block 28A, execute instructions to perform corresponding operations, and communicate the results of the operations back to the first client device 12A via the communication network 14.

Similarly, when the Nth client device 12N receives user inputs intended for the Nth virtual machine, the Nth client device 12N may communicate the user inputs to the remote computing devices 11 via the communication network 14. Based at least in part on the user inputs, the remote computing device 11 may retrieve the Nth data block 28N, execute instructions to perform corresponding operations, and communicate the results of the operations back to the Nth client device 12N via the communication network 14. Thus, the remote computing devices 11 may access (e.g., read and/or write) various data blocks 28 stored in a memory module 24.

To facilitate improving access to stored data blocks 28, a memory module 24 may include a memory controller 30 that controls storage of data in its memory devices 26. In some embodiments, the memory controller 30 may operate based on circuit connections formed (e.g., programmed) in the memory controller 30. Thus, in such embodiments, the memory controller 30 may include one or more application specific integrated circuits (ASICs), one or more field programmable logic gate arrays (FPGAs), or both. In any case, as described above, a memory module 24 may include memory devices 26 that implement different memory types, for example, which provide varying tradeoffs between data access speed and data storage density. Thus, in such embodiments, the memory controller 30 may control data storage across multiple memory devices 26 to facilitate leveraging the various tradeoffs, for example, such that the memory module 24 provides fast data access speed as well as high data storage capacity.

Figure 2:
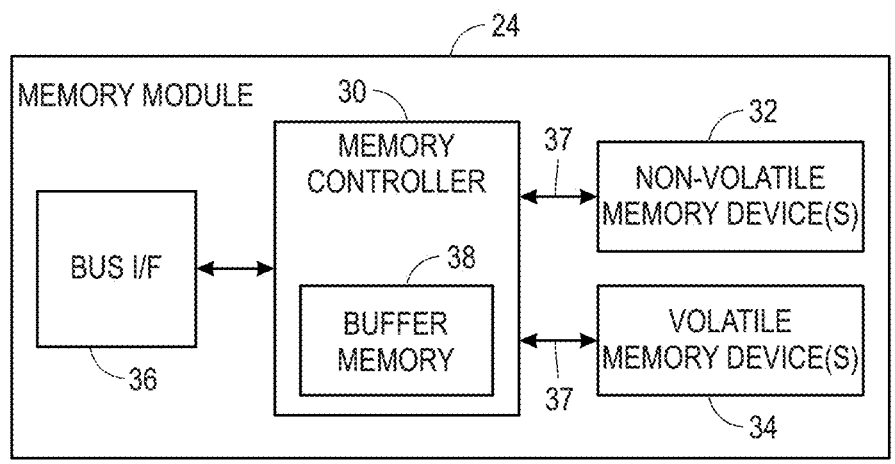
FIG. 2 is a block diagram of a memory module that may be implemented in a remote computing device of FIG. 1, in accordance with an embodiment.

To help illustrate, FIG. 2 depicts an example of a memory module 24 including different types of memory devices 26. In particular, the memory module 24 includes one or more non-volatile memory devices 32 and one or more volatile memory devices 34. In some embodiments, the volatile memory devices 34 may be implemented as dynamic random-access memory (DRAM) and/or static random-access memory (SRAM). In other words, in such embodiments, the memory module 24 may include one or more DRAM devices (e.g., chips or integrated circuits), one or more SRAM devices (e.g., chips or integrated circuits), or both.

Additionally, in some embodiments, the non-volatile memory devices 32 may be implemented as flash (e.g., NAND) memory, phase-change (e.g., 3D XPoint™) memory, and/or ferroelectric random access memory (FeRAM). In other words, in such embodiments, the memory module 24 may include one or more NAND memory devices, one or more 3D XPoint™ memory devices, or both. In fact, in some embodiments, the non-volatile memory devices 32 may provide storage class memory (SCM), which, at least in some instance, may facilitate reducing implementation associated cost, for example, by obviating other non-volatile data storage devices in the computing system 10.

In any case, in some embodiments, the memory module 24 may be implemented by disposing each of the non-volatile memory devices 32 and the volatile memory devices 34 on a flat (e.g., front and/or back) surface of a printed circuit board (PCB). To facilitate data communication via the data bus 25, the memory module 24 may include a bus interface 36. For example, the bus interface 36 may include data pins (e.g., contacts) formed along an (e.g., bottom) edge of the printed circuit board. Thus, in some embodiments, the memory module 24 may be a single in-line memory module (SIMM), a dual in-line memory module (DIMM), or the like.

Additionally, in some embodiments, the bus interface 36 may include logic that enables the memory module 24 to communicate via a communication protocol implemented on the data bus 25. For example, the bus interface 36 may control timing of data output from the memory module 24 to the data bus 25 and/or interpret data input to the memory module 24 from the data bus 25 in accordance with the communication protocol. Thus, in some embodiments, the bus interface 36 may be a double data rate fourth-generation (DDR4) interface, a double data rate fifth-generation (DDR5) interface, a peripheral component interconnect express (PCIe) interface, a non-volatile dual in-line memory module (e.g., NVDIMM-P) interface, or the like.

In any case, as described above, a memory controller 30 may control data storage within the memory module 24, for example, to facilitate improving data access speed and/or data storage efficiency by leveraging the various tradeoffs provided by memory types implemented in the memory module 24. Thus, as in the depicted example, the memory controller 30 may be coupled between the bus interface 36 and the memory devices 26 via one or more internal buses 37, for example, implemented via conductive traces formed on the printed circuit board. For example, the memory controller 30 may control whether a data block 28 is stored in the non-volatile memory devices 32 or in the volatile memory devices 34. In other words, the memory controller 30 may transfer a data block 28 from the non-volatile memory devices 32 into the volatile memory devices 34 or vice versa.

To facilitate data transfers, the memory controller 30 may include buffer memory 38, for example, to provide temporary data storage. In some embodiments, the buffer memory 38 may include static random-access memory (SRAM) and, thus, may provide faster data access speed compared to the volatile memory devices 34 and the non-volatile memory devices 32. The buffer memory 38 may be DRAM or FeRAM in some cases. Additionally, to facilitate accessing stored data blocks 28, the memory module 24 may include an address map, for example, stored in the buffer memory 38, a non-volatile memory device 32, a volatile memory device 34, a dedicated address map memory device 26, or any combination thereof.

In addition, the remote computing device 11 may communicate with a service processor and/or a service bus included in or separate from the processing circuitry 22 and/or the data bus 25. The service processor, processing circuitry 22, and/or the memory controller 30 may perform error detection operations and/or error correction operations (ECC), and may be disposed external from the remote computing device 11 such that error detection and error correction operations may continue if power to the remote computing device 11 is lost. For simplicity of description, the functions of the service processor are described as being included in and performed by the memory controller 30, however, it should be noted that in some embodiments the error correction operations or data recovery operations may be implemented as functions performed by the service processor, processing circuitry 22, or additional processing circuitry located internal or external to the remote computing device 11 or the client device 12.

The memory module 24 is depicted in FIG. 2 as a single device that includes various components or submodules. In some examples, however, a remote computing device may include one or several discrete components equivalent to the various devices, modules, and components that make up memory module 24. For instance, a remote computing device may include non-volatile memory, volatile memory, and a controller that are positioned on one or several different chips or substrates. In other words, the features and functions of memory module 24 need not be implemented in a single module to achieve the benefits described herein.

Figure 3:
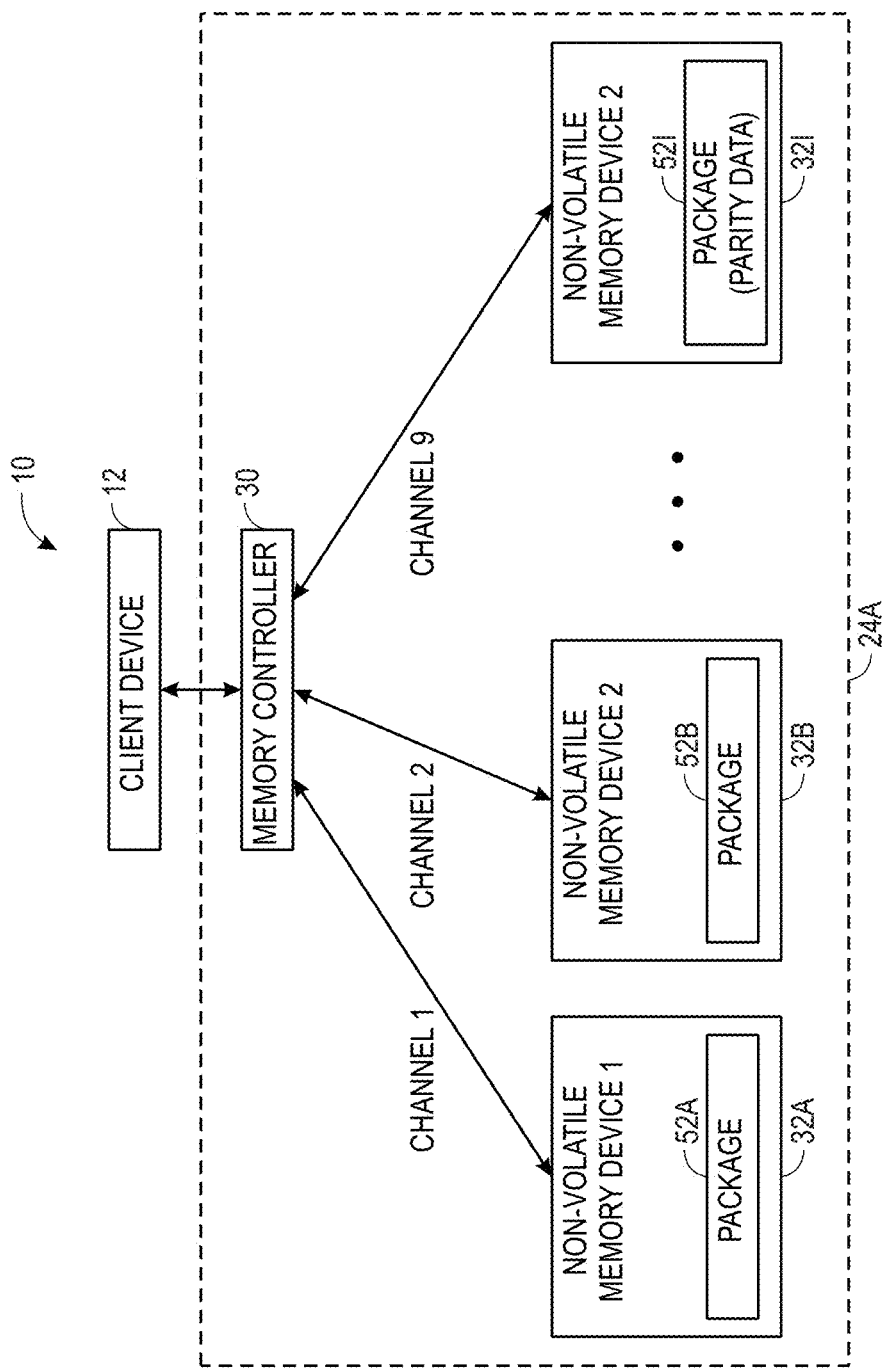
FIG. 3 is a block diagram of the memory module of FIG. 2 arranged in a first non-volatile memory arrangement, in accordance with an embodiment.

To help illustrate, FIG. 3 depicts a block diagram of an example of a package-level RAIX scheme. Generally, FIG. 3 depicts an embodiment of the memory module 24, memory module 24A, that includes nine non-volatile memory devices 32 arranged to form a symmetric RAIX scheme where a full non-volatile memory device 32I is used to store parity data corresponding to the other eight non-volatile memory devices 32A-32H. Each non-volatile memory device 32 may store a segment of data corresponding to memory address in a package 52. The segment of data may be smaller than the overall size of the package 52, for example, the segment of data may be 512 bytes while the package 52 may store several gigabytes. It should be appreciated that the depicted example is merely intended to be illustrative and not limiting. In fact, in some embodiments, RAIX schemes may be implemented using greater than or less than nine non-volatile memory devices 32 with components of any suitable size.

In any case, with regard to the depicted embodiments shown in FIG. 3, each non-volatile memory device 32 stores a particular amount of data accessible to the client device 12. The processing circuitry 22 and/or the memory controller 30 may facilitate communication between the non-volatile memory device 32 and the client device 12 via channels. It may be desirable to be able to recover data stored in the packages 52 in the case of data loss. Thus, a package-level RAIX scheme may be used to protect data of the package 52 stored in the non-volatile memory devices 32.

As depicted, a package-level RAIX scheme is implemented in the memory module 24A, meaning that in the event of data loss of a package 52, data transmitted via respective channels to each non-volatile memory device 32 and stored in the packages 52 may be recovered. The package-level RAIX scheme uses an XOR logical operation to back-up data of each package 52. That is, the data of the package 52A is XOR'd with the data of the package 52B, and the XOR result is XOR'd with the data of the package 52C, and so on until the second-to-last XOR result is XOR'd with the package 52H. The last XOR result is considered the parity data, and is stored into a package 52I. Since each bit of the packages 52A-52H is XOR'd with its corresponding bit of the subsequent package 52, the ending size of the parity data is the same size as the segment of data stored in the packages 52. Thus, in this example, the parity data stored on the package 52I may equal 512 bytes (equal to the size of the individual segments of data backed-up through the package-level RAIX scheme) and the package 52 may have the capacity to store 512 bytes—the same as the other packages 52. As described earlier, if any portion of a respective non-volatile memory device 32 malfunctions and data loss occurs, the parity data stored in the package 52 may be used to recreate the lost data (e.g., by substituting the parity data in the XOR logical operation to recreate the lost data).

To help illustrate, the basic logical properties of XOR are understood to mean exclusive-or, or the XOR logical function, and causes a logical high (e.g., 1) if a first input is a logical low and a second input is a logical high (e.g., 0 is first input and 1 is second input, 1 is the first input and 0 is the second input) but causes an output of a logical low if both the first input and the second input are either a logical high or a logical low (e.g., 0 is first and second input, 1 is first and second input). This output relationship may be leveraged to back-up data stored in the various non-volatile memory devices 32, as described above. As a simplified example, if the package 52A stores 111 and the package 52B stores 000, the package-level RAIX scheme operates to back-up package 52A and 52B with the parity data. Thus, the package 52A is XOR'd with the package 52B to create the parity data. The XOR result of 111 XOR 000 is 111. In the event that the data of the package 52A was lost, this parity data, 111, may be XOR'd with the data of the package 52B to recreate the data of the package 52A—that is, 111 XOR 000 equals 111. If the package 52A stores 101 and the package 52B stores 110, the parity data equals 011. If package 52B were to experience data loss, 011 XOR 101 recreates the data of the package 52B and equals 110.

However, since the data of the package 52 may be the smallest granularity used in the XOR logical operation, any smaller groupings of data creating the packages 52, such as individual memory die of the non-volatile memory device 32, may not be able to be separately recreated. For example, a memory die may malfunction and the rest of the package 52 may function as desired, but because the parity data represents the XOR result of the packages 52, the whole package 52 is recreated from the parity data to save the lost data from the physical malfunction of the memory die. In actual operation, it is unlikely that a whole package 52 of the non-volatile memory device 32 experiences data loss. In fact, this depicted package-level RAIX scheme overprovisions and uses more memory to store the parity data in the package 52I than the amount of memory sufficient to protect data of the memory module 24.

The depicted package-level RAIX scheme follows an 8:1 protection ratio (e.g., eight packages 52A-52H storing data backed up by one package 52I storing parity data). This protection ratio translates into a 12.5% overprovisioning (e.g., 1/8) of the packages 52. In general, the amount of overprovisioning correlates to RAIX scheme efficiency—in other words, the lower the percent of overprovisioning, the less memory is used to provide memory module 24 data protection. Instead, it is more likely that a non-volatile memory device 32 experiences data loss at a memory die level (not depicted in FIG. 3). Thus, a RAIX scheme to protect against data loss at the memory die level is more applicable to normal operation of the computing system 10.

Figure 4:
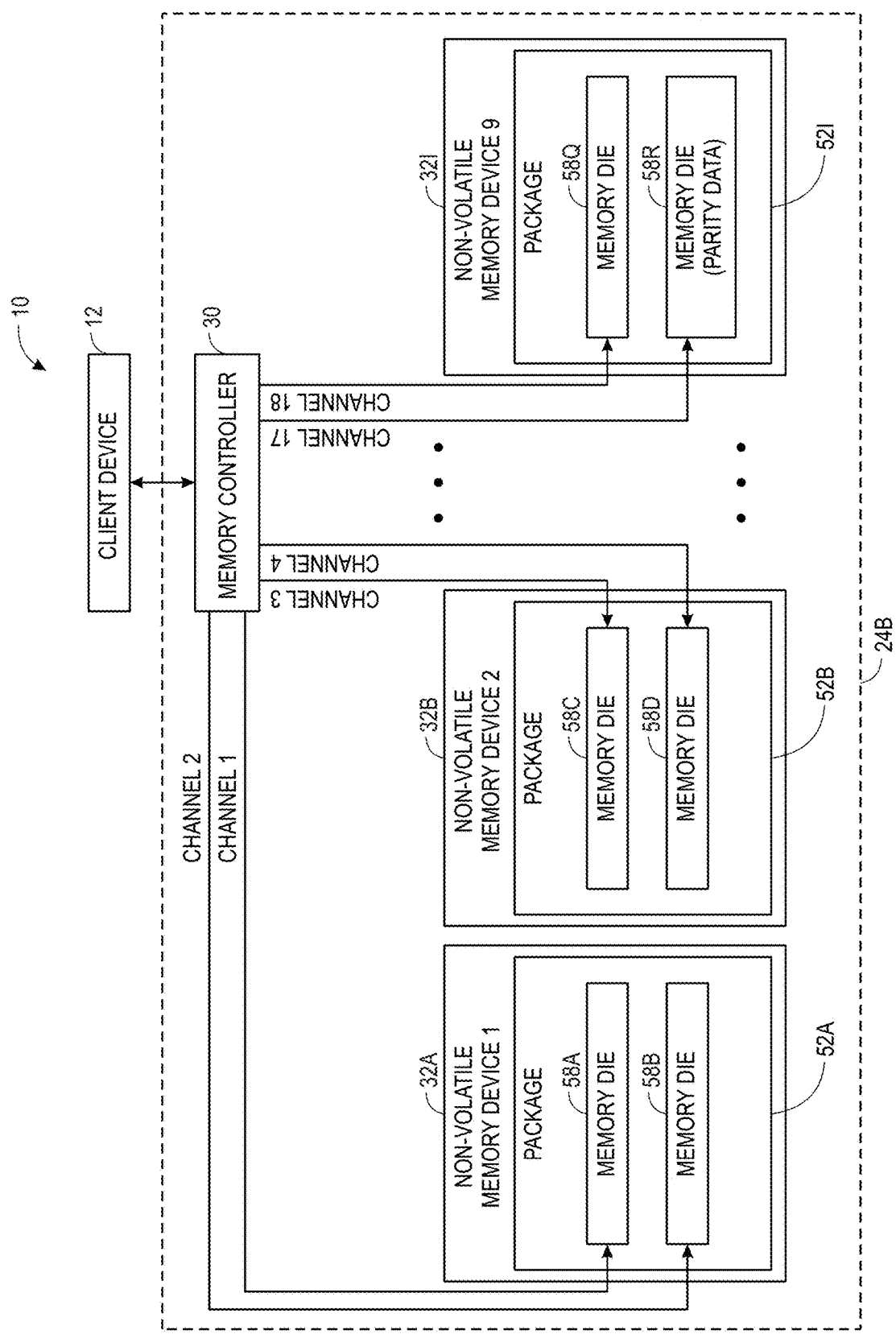
FIG. 4 is a block diagram of the memory module of FIG. 2 arranged in a second non-volatile memory arrangement, in accordance with an embodiment.

To help illustrate the differences between package-level and die-level RAIX schemes, FIG. 4 depicts a block diagram of an example of a die-level RAIX scheme. Generally, FIG. 4 depicts a second embodiment of a memory module 24, memory module 24B, that includes nine non-volatile memory devices 32 each represented as storing a particular amount of data in a memory die 58. It should be appreciated that the depicted example is merely intended to be illustrative and not limiting. In fact, in some embodiments, RAIX schemes may be implemented using greater than or less than nine non-volatile memory devices 32, using greater than or less than eighteen channels, and may include components of any suitable size.

The memory module 24B follows a die-level RAIX scheme where each package 52 is divided into memory die 58 to store segments of data of size 256 bytes. Using the individual memory die 58 for determination of the parity data, instead of the individual packages 52, decreases the overprovisioning from 12.5% (e.g., 1/8) to about 5.8% (e.g., 1/17). This separation, however, may increase circuit complexity because an increased amount of signal routings, components, and/or pins may be used to provide the increased number of channels. The increased design complexity may also increase manufacturing and/or design costs associated with memory module 24 production. Furthermore, increasing the number of signal routings (e.g., channels) may cause signal integrity to decrease as well, for example, from signal interferences. Thus, a scheme that balances these trade-offs with the overall level of overprovisioning may be desirable for some embodiments, while other embodiments may implement memory module 24B.

Figure 5:
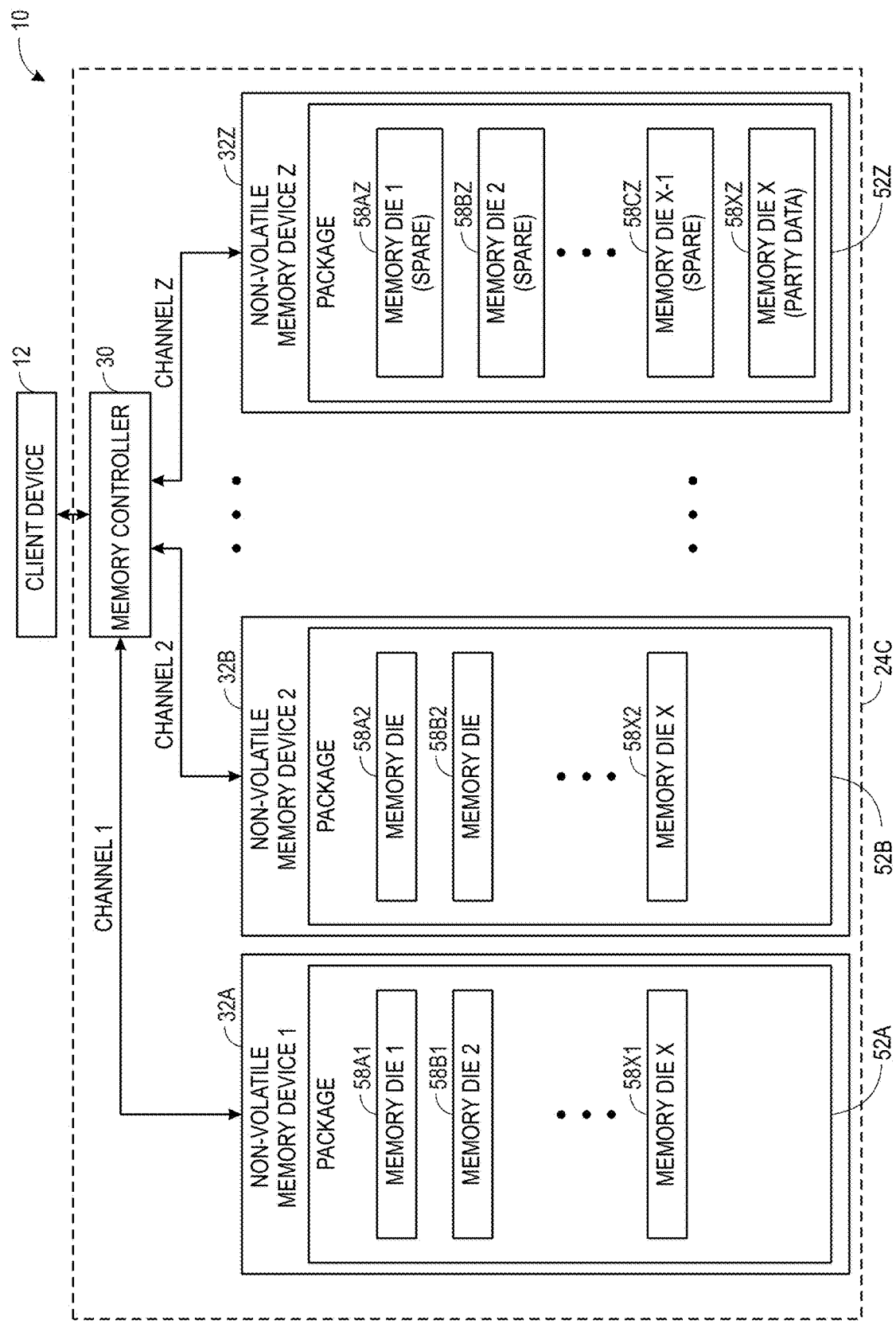
FIG. 5 is a block diagram of the memory module of FIG. 2 arranged in a third non-volatile memory arrangement, in accordance with an embodiment.

To illustrate this compromise, FIG. 5 depicts a block diagram of a second example of a die-level RAIX scheme. This third embodiment of the memory module 24, memory module 24C, includes a Z number of non-volatile memory devices 32 each represented as storing a particular amount of data in a package 52, where the package 52 is separated into multiple memory die 58. It should be appreciated that the depicted example is merely intended to be illustrative and not limiting. In fact, in some embodiments, die-level RAIX schemes may be implemented using any number of memory die 58 per non-volatile memory device 32.

In the depicted die-level RAIX scheme, the packages 52 from FIG. 3 are generally divided into separate memory die 58. For example, memory die 58A1, 58B1, . . . , 58X1 are stored on the same non-volatile memory device 32A and the same package 52A. During operation, the memory controller 30 and/or the processing circuitry 22 may operate to protect the memory module 24C data via the depicted asymmetric die-level RAIX scheme. In the die-level RAIX scheme, each memory die 58 respectively undergoes the XOR logical operation, as opposed to the whole package 52 undergoing the XOR logical operation to create the parity data. The resulting parity data is stored in the memory die 58XZ of non-volatile memory device 32Z. It should be noted that while the parity data is stored in what is depicted as the last memory die 58XZ, there is no restriction on the memory die 58 that the parity data is to be stored in. That is, for example, the parity data may be stored in a memory die 58AZ or on memory die 58A1. The parity data is able to be stored on the memory die 58, thus less memory may be allocated for the purpose of storing the parity data—hence why the memory die 58XZ is all that may be allocated to serve the same purpose as the whole package 52 used to support the package-level RAIX scheme of FIG. 3. The remaining memory die of the non-volatile memory device 32Z may be allocated as a spare memory, where the spare memory die 58AZ, 58BZ, . . . , 58CZ may be used for operational overflow, additional data storage, information used by the memory controller 30 and/or processing circuitry 22 to translate logical addresses into physical address, and the like. Thus, the memory module 24C is an improvement from the memory module 24A that had relatively high overprovisioning and no spare memory, and an improvement from the memory module 24B that has no spare memory and high design complexity.

Dividing the packages 52, for the purposes of redundancy, into the memory die 58 creates an overprovisioning of about 6.25% (e.g., 1/16) which is a decrease from the 12.5% (e.g., 1/8) overprovisioning of memory module 24A and an increase from the 5.8% (e.g., 1/17) overprovisioning of memory module 24B. Despite the small increase in overprovisioning, the die-level RAIX scheme is an improvement to package-level RAIX schemes due to the simplicity of design and the minimal overprovisioning of memory to support the redundancy or protection.

In general, during computing operations, the client device 12 receives inputs from users or other components and, in response to the inputs, requests the memory controller 30 of the memory module 24C to facilitate performing memory operations. The client device 12 may issue these requests as commands and may indicate a logical address from where to retrieve or store the corresponding data. The client device 12, however, is unaware of the true physical address of where the corresponding data is stored since sometimes data is divided and stored in a multitude of locations referenced via one logical address. The memory controller 30 may receive these commands and translate the logical addresses into physical addresses to appropriately access stored data.

Upon determining the physical address for the corresponding data, the memory controller 30 may operate to read the data stored in each respective memory die 58 or may operate to write the data to be written in each respective memory die 58. The memory controller 30 may also parse or interpret data stored in each respective memory die 58 as part of this read/write operation to complete the requested operation from the client device 12. These operations are performed by transmitting segments of data through channels communicatively coupling the non-volatile memory device 32 to the memory controller 30.

The memory controller 30, or other suitable processing circuitry, may facilitate the updating of the parity data stored in the memory die 58. To do this, the data to be stored in each memory die 58 is XOR'd with the data of the subsequent memory die 58 until each memory die 58 is reflected in the parity data. The memory controller 30, or the other suitable processing circuitry, may also facilitate verifying the quality of data stored in the memory die 58. In some embodiments, the memory controller 30 may perform the XOR-ing of the data in the memory die to verify that the resulting parity data is the same. If an error is detected (e.g., the parity data is not the same and thus was determined based on defective data), this may mean a memory die 58 is physically malfunctioning, a data reading or writing error occurred, or the like. The memory controller 30 may perform these redundancy operations in response to an event or a control signal, in response to performing a reading or writing operation, in response to a defined amount of time passing (e.g., for example, data in the memory die 58 is refreshed periodically, including the parity data), or any other suitable indication or event.

As described above, the depicted components of the computing system 10 may be used to perform memory operations. In some embodiments, the die-level RAIX scheme is integrated into the memory operation control flow. In other embodiments, the die-level RAIX scheme is performed in response to a particular indication, signal, event, at periodic or defined time intervals, or the like. However, in certain embodiments, the die-level RAIX scheme is performed both at certain times during memory operations and in response to a control signal. Thus, it should be understood that die-level RAIX schemes may be incorporated into memory operations in a variety of ways.

Figure 6:
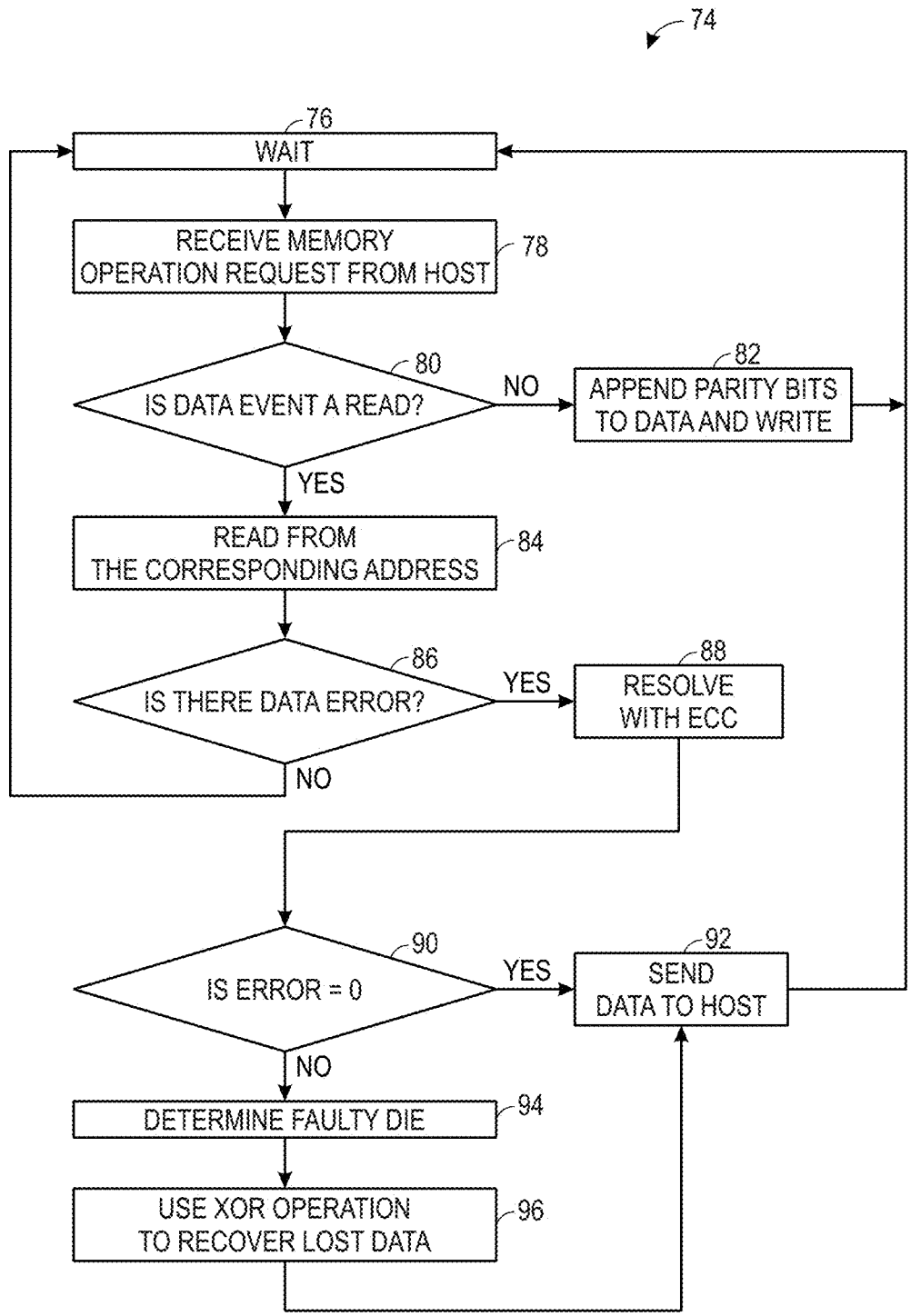
FIG. 6 is a flow diagram of a process for operating the memory module of FIG. 4-5 to perform die-level redundancy operations, in accordance with an embodiment.

To help illustrate, FIG. 6 depicts an example of a process 74 for controlling memory operations and die-level RAIX back-up schemes of a memory module 24. Generally, the process 74 includes the memory controller 30 waiting for a memory operation request from the host (e.g., processing circuitry 22 and/or client device 12) (process block 76), receiving a memory operation request from the host (process block 78), and determining if the memory operation request corresponds to a data read event (decision block 80). In response to the memory operation request not corresponding to a data read event, the memory controller 30 may update the parity data, append the parity data to a segment of data for writing, and write the segment of data (process block 82), where upon completion of the writing, the memory controller 30 may wait for additional memory operation requests from the host (process block 76). However, in response to the memory operation request corresponding to a data read event, the memory controller 30 may read a segment of data from a corresponding memory address (process block 84) and determine if a data error occurred (decision block 86). In response to determining that a data error did not occur, the memory controller 30 may wait for additional memory operation requests from the host (process block 76), however, in response to determining that a data error did occur, the memory controller 30 may attempt to resolve the error using error correction code (ECC) techniques (process block 88), and determine whether the data error is eliminated (decision block 90). In response to determining that the data error is eliminated, the memory controller 30 may send the read data to the host (process block 92), and proceed to wait for additional memory operation requests from the host (process block 76). However, in response to determining that the resolved error is not zero, the memory controller 30 may determine the faulty memory die 58 (process block 94), use an XOR logical operation to recover lost data based on the faulty memory die 58 (process block 96), send the recovered data to the host (process bock 92), and proceed to wait for an additional memory operation request from the host (process block 76).

In any case, as described above, a memory controller 30 may wait for a memory operation request from its host device (process block 76). In this way, the memory controller 30 may be idle, and not performing memory operations (e.g., read, write) in-between read or write access events initiated by the host device.

The memory controller 30 may receive a memory operation request from the host (process block 78) and may perform memory operations in response to the received memory operation request. In some embodiments, the memory operation request may identify the requested data block 28 or segment of data by a corresponding logical address. As described above, when identified by the logical address, a memory controller 30 may convert the logical address into a physical address. This physical address indicates where the data is actually stored in the memory module 24. For example, the memory controller 30 may use an address map, a look-up table, an equation conversion, or any suitable method to convert the logical address to a physical address. The processing circuitry 22 receives the various memory operation requests via communication with the client device 12, however in some embodiments, the processing circuitry 22 may initiate various memory operation requests independent of the client device 12. These memory operation requests may include requests to retrieve, or read, data from one or more of the non-volatile memory devices 32 or requests to store, or write, data into one or more of the non-volatile memory devices 32. In this way, during memory operations, the memory controller 30 may receive a logical address from the host, may translate the logical address into a physical address indicative of where the corresponding data is to be stored (e.g., writing operations) or is stored (e.g., reading operations), and may operate to read or write the corresponding data based on a corresponding physical address.

In response to the memory operation request, the memory controller 30 may determine if the memory operation request corresponds to a data read event (decision block 80). The memory controller 30 may check for changes to data stored in the non-volatile memory devices 32 and/or may operate by assuming data stored in the non-volatile memory devices 32 changes after each data write. Thus, the memory controller 30 generally determines whether a data write event occurred, where the data write event changes data stored in any one of the memory die 58. This determination is performed to facilitate keeping parity data stored in the memory die 58 relevant and/or accurate.

If the memory operation request corresponds to a data write event (e.g, not a data read event), the memory controller 30 may append parity bits to the segment of data to be written and may write the segment of data to memory (process block 82). These parity bits may be used in future error correcting code operations to resolve minor transmission errors (e.g., process block 88). In addition, the memory controller 30 may update the parity data to reflect the changed segment of data. The memory controller 30 of the memory module 24 may perform the XOR logical operation to each of the memory die 58 and may store the XOR result as the updated parity data into a parity data memory die 58 (e.g., memory die 58XZ). In some embodiments, the memory controller 30 may include data of the spare memory in the XOR logical operation, such that the XOR result represents the XOR of each memory die 58 and data stored in the spare memory. It should be noted that, in some embodiments, the memory controller 30 updates the parity data in response to receiving an indication created in response to a timer tracking minimum parity data update intervals or an indication transmitted from the client device 12 to request the update of the parity data. In these embodiments, it may be desirable for the memory controller 30 to update the parity data more frequently than just in response to data write operations and thus by the memory controller 30 determining if the memory operation request corresponds to a data read event, the memory controller 30 may update the parity data in response to each memory operation request except for those which correspond to a data read event including, for example, requests based on tracked time intervals. Upon appending and writing the segment of data to memory, the memory controller 30 may wait to receive an additional memory operation request from the host (process block 76).

However, in response to determining the memory operation request corresponds to a data read event, the memory controller 30 may read a segment of data at a corresponding memory address (decision block 84). The memory operation request includes a logical address at which a desired segment of memory is stored. The memory controller 30 may retrieve the desired segment of memory at the indicated logical address in response to the memory operation request (e.g., through referencing a converted physical address and operating to retrieve the segment of data from the corresponding memory die 58).

After reading the segment of data, the memory controller 30 may determine if the data is correct (e.g., not defective) (decision block 86). The memory controller 30 may perform various data verification techniques to confirm the data is correct by verifying the data read is the same as was initially represented with the parity data stored on memory die 58. These data verification techniques may facilitate the detection of both physical and digital defects associated with the memory module 24. These defects may include issues such as data writing errors, mechanical defects associated with the physical memory die 58, mechanical defects associated with the non-volatile memory device 32, and the like. To verify the data, for example, the memory controller 30 may proceed to use XOR verification to determine if the data read in response to the data read event is uncorrupted and correct. To do this, the memory controller 30 of the memory module 24 may XOR the data of each memory die 58, and in some embodiments the data of each memory die 58 and the spare memory, to determine an additional XOR result. Upon calculating the additional XOR result, the memory controller 30 may determine if the XOR results are the same. The memory controller 30 of the memory module 24 may compare the additional XOR result and the parity data stored in memory die 58 to determine if the XOR results are equal or substantially similar (e.g., within a threshold of similarity such that the results are considered equal).

In response to determining if the XOR results are the same and thus the read data is correct (e.g., found no data error), the memory controller 30 may proceed to wait for an additional memory operation request from the host (process block 76). However, in response to determining that the XOR results are not the same and thus the read data is incorrect (e.g., found data error), the memory controller 30 may attempt to resolve the data error with error correcting code (ECC) techniques (process block 88). Error correcting code techniques may include adding redundant parity data to a segment of data such that, upon reading, the original segment of data may still be recovered even if minor data corruption occurs. There are a wide variety of valid ways to perform this preliminary quality control step to verify that the data error is not caused by a minor transmission issue, such as convolutional codes and block codes methods.

After attempting to resolve the data error with error correcting code techniques, the memory controller 30 may determine if the data error has been eliminated from the correction (decision block 90). If the memory controller 30 determines the error equals zero after implementing the error correcting code techniques, the memory controller 30 may send the read data to the host device for further processing and/or use in computing activities. After transmission of the read data, the memory controller 30 waits for an additional memory operation request from the host (process block 78).

However, if the memory controller 30 determines the data error is not eliminated (e.g., error does not equal zero), the memory controller 30 may proceed to determine which of the memory die 58 is defective or faulty (process block 94). The memory controller 30 may perform various determination activities to determine which memory die 58 is faulty, such as systematic testing of the memory die 58 responses to test write or read operations. Furthermore, in some embodiments, the memory controller 30 may communicate the data error to the client device 12 and receive an indication from the host, such as an indication originating from a user of the client device 12, communicating which memory die 58 is defective or faulty.

When the memory controller 30 determines which memory die 58 is faulty, the memory controller 30 may use the parity data to recover the data lost in response to the faulty memory die 58 (process block 96). The memory controller 30 may recover the lost data by performing an inverse of the XOR logical operation. That is, the memory controller may XOR each of the memory die 58 without XOR-ing the faulty memory die 58 data and with including the parity data. Assume, for example, that a memory die 58A2 is faulty—in this example, the memory controller 30 XORs all of the memory die 58 to determine the lost data of memory die 58C without XOR-ing the data of the faulty memory die 58A2 and substituting the data of the memory die 58A2 with the parity data to recreate the lost data of the memory die 58A2 (e.g., the data of memory die 58A1 XOR'd with the data of memory die 58B2 XOR'd with the parity data of memory die 58 to determine lost data of the memory die 58A2). Furthermore, in some embodiments, the memory controller 30 performs this recovery operation in response to receiving a proceed indication from the processing circuitry 22, or other suitable processing circuitry. In this way, in these embodiments, the memory controller 30 may wait to recover the lost data until a physical repair is performed.

Upon recovering the lost data, the memory controller 30 may transmit the recovered data to the host (process block 92) and proceed to wait for an additional memory operation request (process block 76). The memory controller 30 may continue the process 74 to keep the parity data up to date, to monitor data quality stored within the non-volatile memory devices 32, and/or to perform recovery operations in the event of data loss.

Thus, technical effects of the present disclosure include facilitating improved redundancy operations to protect against data loss at a die-level or memory die sized granularity. These techniques describe systems and methods for performing XOR logical operations to create parity data, verify data integrity or quality, and to recover data in the event of data loss, all at the die-level instead of the package-level. These techniques also provide for one or more additional spare memory die, an improvement from package-level redundancy operations.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
   a printed circuit board;
   a plurality of memory devices each disposed on a planar surface of the printed circuit board, wherein each memory device of the plurality of memory devices comprises two or more memory die;
   a plurality of channels communicatively coupled to each memory device of the plurality of memory devices, wherein each channel of the plurality of channels are associated with at least one of the two or more memory die of each memory device; and
   a memory controller communicatively coupled to the plurality of channels, wherein the memory controller is configured to maintain a die-level redundancy scheme via data transmission with at least one memory device of the plurality of memory devices, wherein the memory controller is configured to generate parity data in response to a data write event.

2. The apparatus of claim 1, wherein one memory device of the plurality of memory devices comprises a memory die to be represented in the parity data and a memory die dedicated to storing the parity data.

3. The apparatus of claim 1, wherein the data write event comprises at least one of a memory read operation, a memory write operation, or an indication or trigger generated in response to a time period passing, or any combination thereof.

4. The apparatus of claim 1, wherein the memory controller is configured to generate the parity data based at least in part on data transmitted on one of the channels associated with one of the two or more memory die.

5. The apparatus of claim 1, wherein the memory controller is configured to write the parity data to one of the two or more memory die.

6. The apparatus of claim 1, wherein the two or more memory die comprise at least one of flash memory, NAND memory, phase-change memory, 3D XPoint™ memory, or ferroelectric random access memory, or any combination thereof.

7. The apparatus of claim 1, wherein the memory controller is configured to use an exclusive-or (XOR) logical operation to determine parity data representative of data stored in each memory device of the plurality of memory devices.

8. The apparatus of claim 7, wherein the memory controller is configured to:
   determine that a first memory die of the two or more memory die comprises defective data;
   XOR the parity data with a subset of the two or more memory die that excludes the first memory die; and
   transmit an XOR result as recreated data corresponding to the first memory die, wherein the recreated data is equal to data stored in the first memory die after the data write event.

9. The apparatus of claim 1, wherein the memory controller is configured to write the parity data on a first memory die of a memory device of the plurality of memory devices, wherein a second memory die of the memory device of the plurality of memory devices is configured as a spare among the plurality of memory devices, and wherein data stored in the second memory die is configured to not be used to generate the parity data.

10. A method, comprising:
identifying a data write event at a first memory die of a memory device on a module that comprises a plurality of multi-die packaged memory devices;
generating, in response to the identified data write event, an exclusive-or (XOR) result using an XOR logic operation on data that corresponds to the first memory die of the memory device, wherein the data is configured to be transmitted through a channel of a plurality of channels, and wherein each channel of the plurality of channels are associated with different memory die of each memory device;
writing the XOR result as parity data to a second memory die of the memory device;
determining that the first memory die of the memory device experienced a data error; and
restoring the data that corresponds to the first memory die of the memory device using an inverse of the XOR logic operation on the parity data from the second memory die of the memory device.

11. The method of claim 10, wherein the data write event comprises at least one of
a data read event, a data write event, a periodic refresh event, or any combination thereof.

12. The method of claim 10, wherein the XOR logical operation comprises XOR-ing the first memory die and a third memory die to create the XOR result.

13. The method of claim 10, wherein the first memory die is configured as phase-change memory, 3D XPoint™ memory, or any combination thereof.

14. The method of claim 10, wherein each is the first memory die and the second memory die are coupled to a memory controller through one or more channels configured to communicate segments of data during memory operations.

15. The method of claim 10, wherein the first memory die and the second memory die are disposed on the memory device.

16. A memory module, comprising:
a plurality of memory devices comprising a first subset of memory die and a second subset of memory die;
a plurality of channels communicatively coupled to each of the plurality of memory devices, wherein each channel of a subset of the plurality of channels are associated with at least one of the first subset of memory die; and
a memory controller communicatively coupled to each of the plurality of channels, wherein the memory controller is configured to:
perform a data read/write operation via the plurality of channels;
determine that data stored in the first subset of memory die changed;
determine parity data indicative of data stored in the first subset of memory die based at least in part on determining that the data stored in the first subset of memory die changes;
store the parity data in the second subset of memory die;
determine that a data loss event occurred; and
recreate lost data using the parity data and data stored in the first subset of memory die based at least in part on determining that the data loss event occurred.

17. The memory module of claim 16, wherein the memory controller is configured to recreate lost data associated with a respective die of the first subset of memory die via a logical operation to exclusive-or (XOR) the data stored in the first subset of memory die with the parity data.

18. The memory module of claim 16, wherein the plurality of channels comprises a channel communicatively coupled to a memory die, wherein the second subset of memory die comprises a spare memory die and a memory die configured to store the parity data, and wherein the spare memory die is configured to store information associated with operational overflow, information associated with a logical to physical address translation, or any combination thereof.

19. The memory module of claim 16, wherein each memory die of the first subset of memory die and of the second subset of memory die comprises 3D XPoint™ memory.

20. The memory module of claim 16, wherein the memory controller is configured to:
compare two exclusive-or (XOR) results to determine whether the two XOR results are the same; and
indicate the data stored in the first subset of memory die is correct when the XOR results are the same.

* * * * *